(12) United States Patent
Nakagawa

(10) Patent No.: US 6,777,350 B2
(45) Date of Patent: Aug. 17, 2004

(54) METHOD AND DEVICE OF FORMING A FILM USING A COATING MATERIAL AND METHOD OF MANUFACTURING A SEMICONDUCTOR DEVICE

(75) Inventor: Seiji Nakagawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 11 days.

(21) Appl. No.: 10/199,328

(22) Filed: Jul. 22, 2002

(65) Prior Publication Data

US 2003/0022515 A1 Jan. 30, 2003

(30) Foreign Application Priority Data

Jul. 26, 2001 (JP) ........................................ 2001-225689

(51) Int. Cl.$^7$ ........................ H01L 21/31; H01L 21/469
(52) U.S. Cl. ........................ 438/782; 438/780; 438/781; 427/240; 118/52; 118/320
(58) Field of Search ................................. 438/780, 781, 438/782; 118/52, 370; 427/240, 425

(56) References Cited

U.S. PATENT DOCUMENTS 5,939,139 A * 8/1999 Fujimoto .................... 427/240

FOREIGN PATENT DOCUMENTS

JP  2000-288458  10/2000

* cited by examiner

Primary Examiner—Alexander Ghyka
(74) Attorney, Agent, or Firm—Finnegan, Henderson, Farabow, Garrett & Dunner, L.L.P.

(57) ABSTRACT

A material film forming method is provided which comprises coating a liquid material on a surface of a substrate to form a material film of the liquid material the on the surface of the substrate, while rotating the substrate, and drying the material film, while rotating the substrate and letting air or nitrogen gas blow onto a predetermined area of the material film.

13 Claims, 5 Drawing Sheets

METHOD AND DEVICE OF FORMING A FILM USING A COATING MATERIAL AND METHOD OF MANUFACTURING A SEMICONDUCTOR DEVICE

CROSS-REFERENCE TO RELATED APPLICATIONS

This application is based upon and claims the benefit of priority from the prior Japanese Patent Application No. 2001-225689, filed Jul. 26, 2001 the entire contents of which are incorporated herein by reference.

BACKGROUND OF THE INVENTION

1. Field of the Invention

The present invention relates to a method and device of forming a coating film in a manufacturing process of a semiconductor device and a method of manufacturing a semiconductor device using the above-mentioned method.

2. Description of the Related Art

The photolithography step of a manufacturing process of a semiconductor device, a liquid crystal device, etc., constitutes an important step of forming various interconnect patterns. This photolithography step is the technique of, for example, transferring an interconnect pattern by an exposure device called a stepper to a photoresist, after the photoresist has been coated on a semiconductor substrate, and forming a photoresist pattern by developing the coated photoresist with an aqueous alkali solution. As a liquid material coating film for use in a semiconductor device etc., there are not only the resist coating film but also an anti-reflection film, a mask film (SOG film), an insulating interlayer (SOD film), a low dielectric constant film (Lok film) and so on. The method and device of forming these films constitute a coating film forming method and device.

In a resist coating process using a conventional photoresist coating device as shown in FIG. 9, a semiconductor wafer 101, such as silicon, serving as a substrate to be processed is set on a spin chuck 102 which vacuum sucks the semiconductor wafer 101 and which is rotatable at high speeds. A photoresist supply nozzle 105 is so provided at an arm 103 so as to be set opposite to the semiconductor wafer 101 above the spin chuck 102. A photoresist is supplied from the photoresist supply nozzle 105 onto the semiconductor wafer 101. After this, the spin chuck 102 is rotated to allow the photoresist on the semiconductor wafer 101 to be spin-dried. A solvent supply nozzle 106 is mounted on the upper end of a movable arm 104 at an outer peripheral side of the spin chuck 102. After the photoresist has been spin-dried, the solvent supply nozzle 106 supplies a solvent onto the photoresist at the outer peripheral portion of the semiconductor wafer 101 while the semiconductor wafer 101 is rotated. By doing so, only the photoresist on the outer peripheral portion of the semiconductor wafer 101 is dissolved and removed.

If the drying of the photoresist is not adequate, the coating film and solvent are mixed together, thus causing a bulge at the outer peripheral edge portion of the coating film. As shown in FIG. 8B, therefore, the thickness of the photoresist film at the outer peripheral portion of the semiconductor wafer 101 becomes thicker. This causes the coating film to be left there at a time of etching. It is, therefore, necessary to make the etching time longer so as to eliminate such a thicker portion. As a result, the throughput is lowered. Further, in the conventional technique, the solvent in the photoresist is volatilized through the rotation action to attain the drying of the photoresist and it is, therefore, necessary to rotate the semiconductor substrate for a longer time so as to attain the adequate drying of the coating film. This process also leads to a lowering of the throughput. Further, at the time of spin-drying the semiconductor wafer, the rotation is slower at the central portion, so that the drying extent becomes slower than at the peripheral portion of the semiconductor wafer. With a tendency toward an increase of a wafer size from 8-inch to 12 inch, the extent of drying greatly differs depending upon the positions of the semiconductor wafer (that is, the extent of drying is slower at the central portion and faster at the peripheral portion of the semiconductor wafer). For the conventional technique, therefore, it becomes difficult to take a corresponding countermeasure.

BRIEF SUMMARY OF THE INVENTION

According to a first aspect of the present invention, there is provided a method of forming a film comprising coating a liquid material on a surface of a substrate to form a material film of the liquid material the on the surface of the substrate, while rotating the substrate; and drying the material film, while rotating the substrate and letting air or nitrogen gas blow onto a predetermined area of the material film.

According to a second aspect of the present invention, there is provided a method of forming a semiconductor device comprising coating a liquid material on a surface of a substrate to form a material film of the liquid material on the surface of the substrate, while rotating the substrate; drying the material film under the rotation of the substrate while letting air or nitrogen gas blow onto a predetermined area of the material film; coating a resist on a surface of the material film to form a resist film on the surface of the material film, while rotating the substrate; drying the resist film under the rotation of the substrate while letting air or nitrogen gas blow onto a predetermined area of the resist film; patterning the resist film to form a resist pattern; and patterning the material film to form a material pattern of a predetermined shape using the resist pattern as a mask.

According to a third aspect of the present invention, there is provided a film forming device comprising a supporting table configured to support a substrate; and a gas blowing nozzle provided in opposition to the substrate and configured to let a gas including air or nitrogen gas blow onto the substrate.

DETAILED DESCRIPTION OF THE INVENTION

Figure 1:
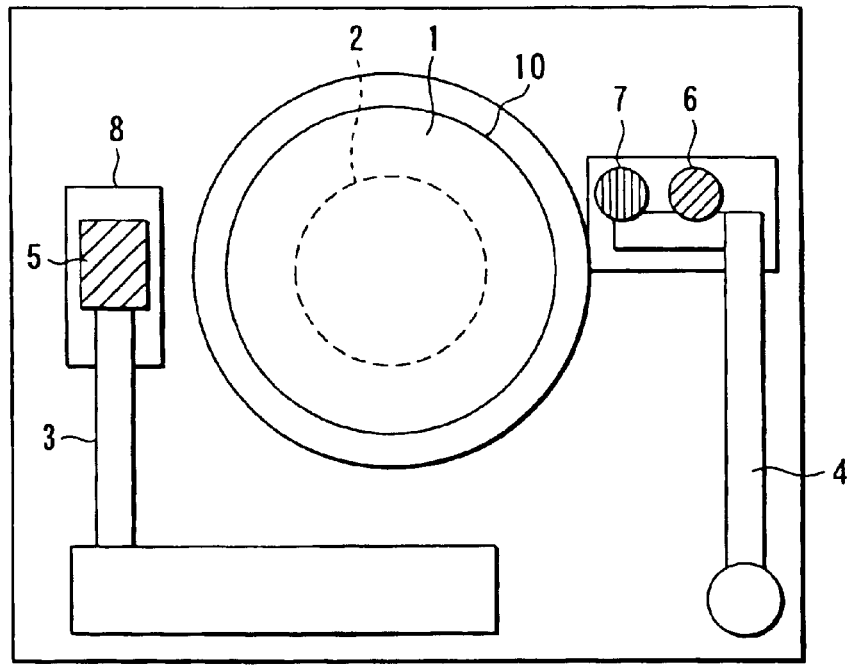
FIG. 1 is a plan view diagrammatically showing a device for forming a resist film as a coating film according to a first embodiment of the present invention.

The embodiment of the present invention will be described below with reference to the drawing.

First, a first embodiment of the present invention will be explained below with reference to FIGS. 1 and 2, FIGS. 3A to 3C and FIGS. 8A and 8B.

Figure 2:
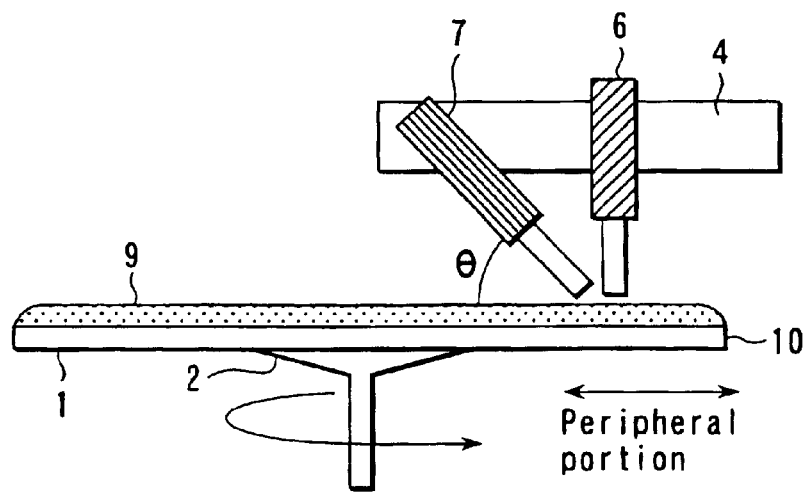
FIG. 2 is a partial cross-sectional view showing the coating film device according to the first embodiment of the present invention which explains a semiconductor wafer portion.
Figure 3A:
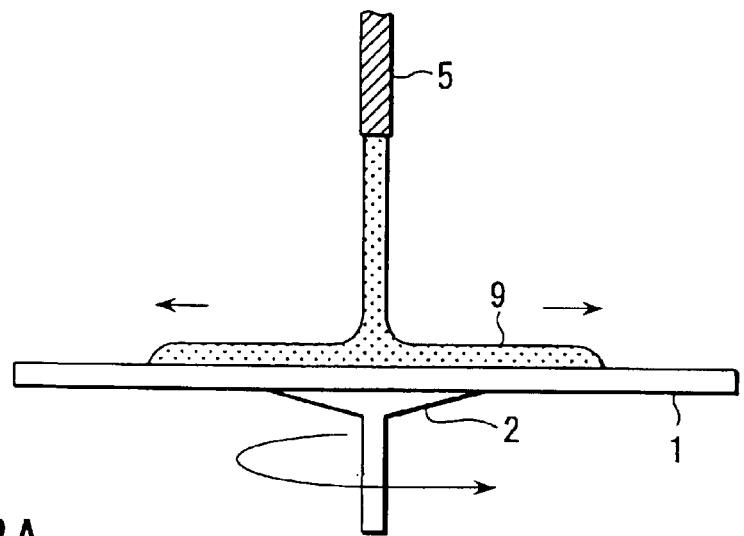
FIG. 3A is a view showing a step of a method of forming a coating film on the first embodiment of the present invention.
Figure 3B:
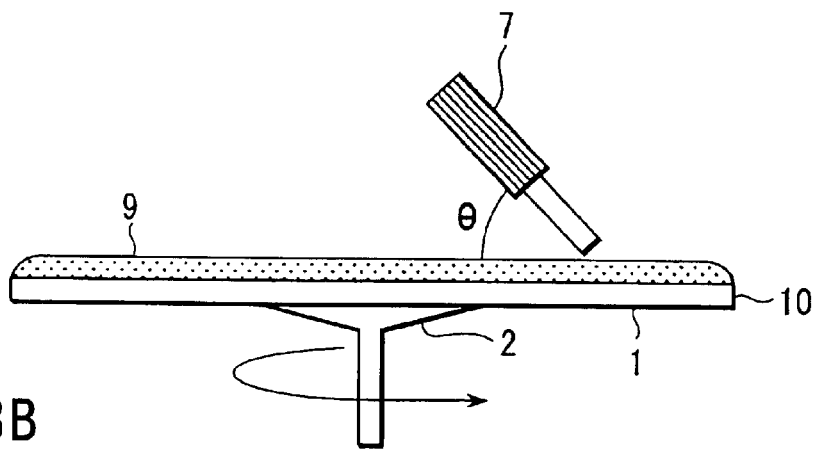
FIG. 3B is a view showing a step of the method of forming a coating film on the first embodiment of the present invention.
Figure 3C:
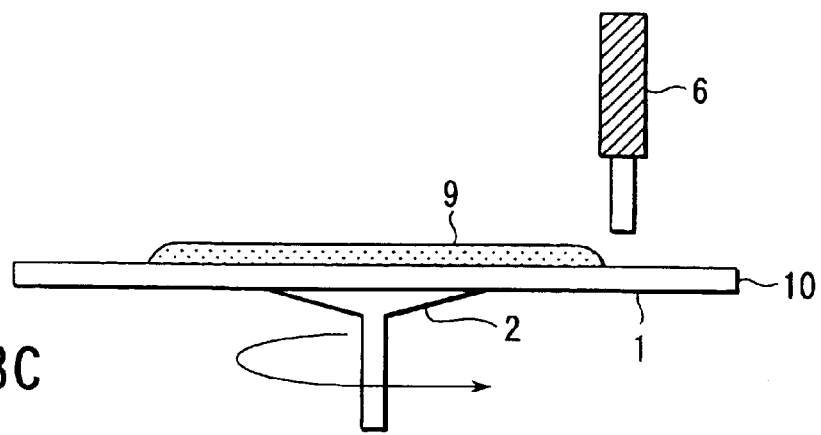
FIG. 3C is a view showing a step of the method of forming a coating film on the first embodiment of the present invention.
Figure 8A:
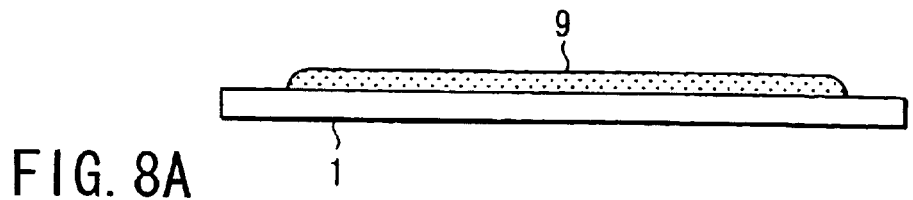
FIG. 8A is a cross-sectional view showing a semiconductor wafer portion obtained by a method of forming a coating film according to the first embodiment of the present invention which explains a photoresist film on the semiconductor wafer.
Figure 8B:
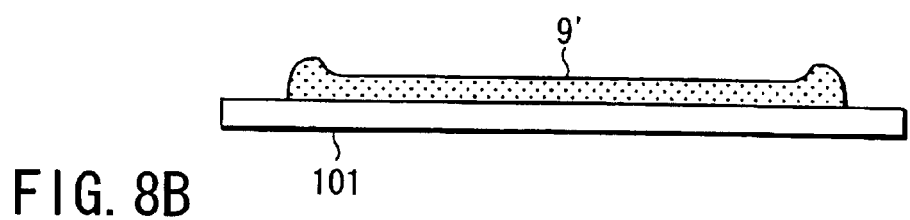
FIG. 8B is a cross-sectional view showing the semiconductor wafer portion obtained by a conventional coating film forming method which explains the formation of a photoresist film on the semiconductor wafer.
Figure 9:
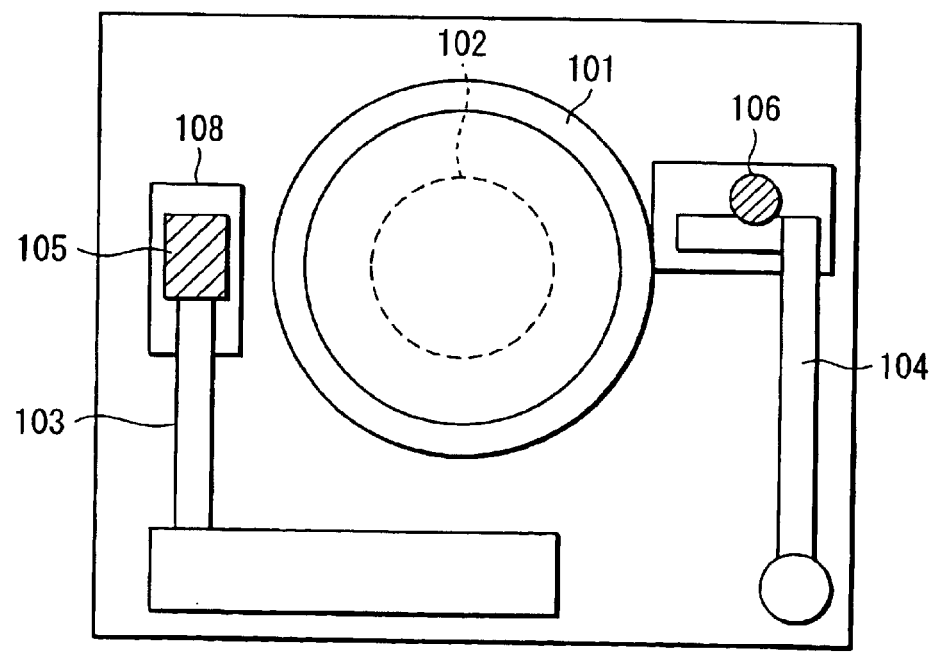
FIG. 9 is a plan view showing a conventional device for coating a resist film.

FIG. 1 is a plan view diagrammatically showing a coating film forming device according to a first embodiment of the present invention, FIG. 2 is a partial cross-sectional view showing the coating film forming device of FIG. 1 with a semiconductor wafer set on the device, FIGS. 3A, 3B and 3C, each, are a partial cross-sectional view showing a device for forming a coating film, including a semiconductor wafer, at each process of the method of forming a coating film according to the embodiment, and FIGS. 8A and 8B are coating films formed by the present embodiment and conventional coating film forming device, respectively. As shown in FIG. 1, a semiconductor wafer 1, such as silicon, serving as a substrate to be processed is vacuum chucked on a spin chuck 2. The spin chuck 2 is rotated at high speeds at an operation time and, by doing so, the semiconductor wafer 1 is rotated at high speeds. Further, the coating film forming device includes a first arm 3 movable toward a position above the spin chuck 2 and a second arm 4 movable by, for example, 70 mm from a peripheral edge 10 toward the center of the semiconductor wafer 1. A photoresist supply nozzle 5 is set at a forward end of the first arm 3 and both a solvent supply nozzle 6 and air blowing nozzle 7 are set at the forward end of the second arm 4. The photoresist supply nozzle 5 is held into a storage section 8 in the device when it is not used.

The method of coating a resist according to the embodiment will be explained below with reference to FIGS. 1 to 3C. First, a semiconductor wafer 1 is vacuum chucked on a spin chuck 2. Then the spin chuck 2 is rotated at a high speed of a few thousand rpm and, by doing so, the semiconductor wafer is rotated at a high speed of a few thousand rpm. In this state, the first arm 3 is moved to a position above the spin chuck 2 and a photoresist (an anti-reflection film material in the case of forming the anti-reflection film) is discharged for a few seconds from the photoresist supply nozzle 5 onto the surface of the semiconductor wafer 1 to form a coating film 9 as a photoresist film on the surface of the semiconductor wafer 1. It is to be noted that, in the case of forming an anti-reflection film, an anti-reflection film material is discharged onto the surface of the semiconductor wafer 1 to form a coating film 9 as an anti-reflection film on the surface of the semiconductor wafer 1. The coating film 9 is formed by supplying the photoresist dropwise from the photoresist supply nozzle 5 onto the semiconductor wafer 1 and spreading the supplied photoresist for about 1 to 4 seconds over the whole surface of the semiconductor wafer 1 (FIG. 3A). After this, the first arm 3 is moved into the photoresist supply nozzle storage section 8 and stored there. After the photoresist has been spread over the whole surface of the semiconductor wafer 1, the spin chuck 2 is rotated at a speed of a few thousand rpm and, by doing so, the semiconductor wafer 1 is rotated at a few thousand rpm to allow the coating film 9 to be spin-dried. The proper number of rotations at this time is 2000 to 3500 rpm for an eight-inch sized semiconductor wafer and 1000 to 1500 rpm for a 12-inch sized semiconductor wafer.

If the rotation speed is too fast, a turbulence occurs at a coating film surface portion due to the rotation of the semiconductor wafer and a noticeable film thickness variation (an irregular coating film thickness variation) of the coating film occurs. Since the rotation speed at the outer peripheral portion of the semiconductor wafer differs due to the size of the semiconductor wafer, the critical number of rotations at which there occurs no irregular coating is decided depending upon the size of the semiconductor wafer. Thus, the number of rotations at the spin-drying time is determined by the size of the semiconductor wafer. Further, the rotation speed of the semiconductor wafer is faster at the outer peripheral portion than at the central portion of the semiconductor wafer and, as the size of the semiconductor wafer is increased, the drying speed of the coating film largely differs depending upon the position of the semiconductor wafer. That is, if the size of the semiconductor wafer becomes greater, then the number of rotations available at a time of spin drying is lowered and hence the drying speed of the coating film becomes slower. Further, if the size of the semiconductor wafer becomes larger, since the drying speed difference becomes greater between at the central portion and at the outer peripheral portion of the semiconductor wafer, the required drying time becomes longer, thus leading to a lowering in product throughput. After the spin drying of the coating film, the second arm 4 is moved to a position above the outer peripheral portion of the semiconductor wafer 1 to set the air blowing nozzle 7 at a position 2.1 mm inward the semiconductor wafer from the periphery 10 of the semiconductor wafer 1 as shown in FIG. 2.

The air blowing nozzle 7 is set at an angle θ of 20° to 60°, preferably 45° (FIG. 2), opposite to the semiconductor wafer 1 to incline toward the central portion side, i.e. rotation center side, of the semiconductor wafer 1 and, by the blowing of a gas, such as air or nitrogen gas, at a flow rate of 20 to 30 ml/minute from the air blowing nozzle 7 while rotating the semiconductor wafer at a speed of a few thousand rpm, the photoresist or anti-reflection film material at the outer peripheral portion is spin-dried at about 2 to 3 times faster than for the conventional technique (FIG. 3B). After this, from the solvent supply nozzle 6 set at the second arm 4, a solvent such as a thinner is discharged onto the semiconductor wafer at a flow rate of 15 ml/minute at a position 2.0 mm inward the semiconductor wafer from the outer periphery of the semiconductor wafer 1. By doing so, the photoresist (or anti-reflection film material) at the outer peripheral portion of the semiconductor wafer is removed. The air blowing nozzle 7 can be operated in interlock with the solvent supply nozzle 6 and, simultaneously with the discharge of the solvent from the solvent supply nozzle 6, let air or nitrogen gas, etc., blow in a direction from the center of the semiconductor wafer 1 toward an outside at a contacting area between the solvent and the coating type film such as a photoresist film (a coating film) 9, anti-reflection film, and so on. After this, the semiconductor wafer is rotated at a high speed of a few thousand rpm to spin-dry the solvent at the outer peripheral portion. By doing so, a series of coating process is ended (FIG. 3C).

According to the embodiment of the present invention, as set out above, the drying speed at the outer peripheral portion of the semiconductor wafer can be made faster than for the conventional technique by letting the air blow from the air blowing nozzle 7, so that the processing time can be largely shortened and, as a result, it is possible to improve the throughput involved. Since the discharged solvent as well as the photoresist at the outer peripheral portion of the semiconductor wafer resolved by the solvent is prevented from moving inward by letting the air blow toward the outside of the semiconductor wafer 1, any thicker film portion is prevented from being formed at a peripheral portion of a coating film 9' encountered at the conventional art (FIG. 8B) and it is possible to form a coating film 9 of uniform thickness on the semiconductor wafer 1 (FIG. 8A). Further, a liquid-like or a mist-like foreign material liable to be produced at the outer peripheral portion of the semiconductor wafer can be completely eliminated from the semiconductor wafer by the air blowing from the air blowing nozzle 7.

In this embodiment, the nozzle of letting the air, nitrogen gas, etc., blow is so configured as to be set at an angle of 20° to 60° with respect to and in opposition to the semiconductor wafer. This is because the present embodiment adopts a structure by which any liquid-like or a mist-like foreign material liable to be produced at the outer peripheral surface of the semiconductor wafer by the discharge of the solvent can be eliminated from the semiconductor wafer by means of the air blowing nozzle. If the angle of the air blowing nozzle made with respect to the semiconductor wafer is over 60°, then the drying effect can be enhanced but the elimination of the foreign material is not adequate, while, on the other hand, at that angle being below 20° it is possible to eliminate the foreign material but the drying efficiency is lowered.

Now, an explanation will be made below about a second embodiment of the present invention.

Figure 4:
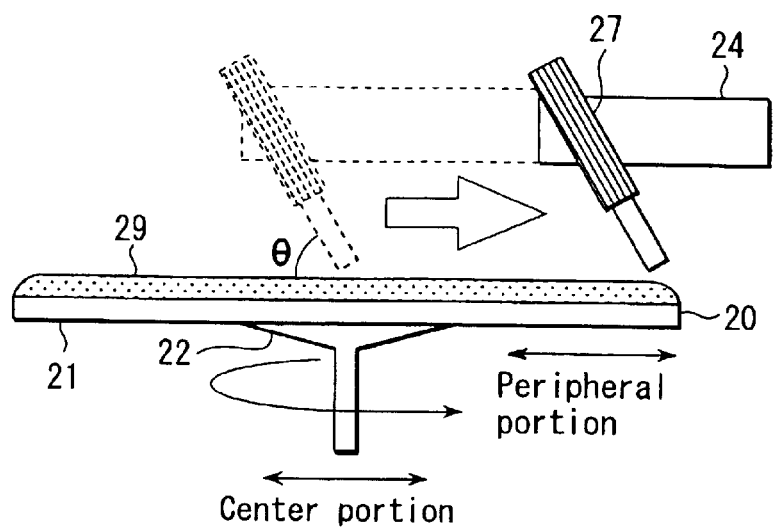
FIG. 4 is a view diagrammatically showing a device for forming a resist film as a coating film according to a second embodiment of the present invention.

FIG. 4 is a partial cross-sectional view for explaining the drying process of a semiconductor wafer portion on a coating film forming device for forming a resist coating film on the second embodiment of the present invention. A semiconductor wafer 21, such as silicon, serving as a substrate to be processed is suction-held by a vacuum chuck and supported by a spin chuck 22 to be rotatable. Within an device are provided a first arm (not shown) movable to a position above the spin chuck 22 and a second arm 24 movable from the center of the semiconductor wafer 21 toward the peripheral portion 20 of the semiconductor wafer 21. The first arm is equipped with a photoresist supply nozzle and the second arm 24 has a solvent supply nozzle (not shown) and an air blowing nozzle 27. The photoresist supply nozzle is stored in a storage section in the device.

An explanation will be made below about the resist coating method using the resist coating apparatus of the present embodiment. First, the semiconductor wafer 21 is rotated by the spin chuck 22 at a high rotation speed of a few thousand rpm. In this state, the first arm is moved to a position above the spin chuck 22 and a photoresist (an anti-reflection film material in the case of forming the anti-reflection film) is discharged for a few seconds from the photoresist supply nozzle to form a coating film 29 as the photoresist film or anti-reflection film material film on the surface of the semiconductor wafer 21. The coating film 29 is spread over the whole surface of the semiconductor wafer 21 in about one to four seconds after the photoresist has been supplied dropwise from the photoresist supply nozzle onto the semiconductor wafer 21. While, after this, the semiconductor wafer 21 is being rotated at a rotation speed of a few thousand rpm, the first arm is moved into a photoresist supply nozzle storage section and stored there.

The air blowing nozzle 27 for letting the air blow onto the photoresist film can be set at any position on the surface of the semiconductor wafer 21 and be moved at any speed after the photoresist film has been formed on the surface of the semiconductor wafer 21. For example, the blowing of a gas such as a nitrogen gas onto the center position of the semiconductor wafer 21 is started after five seconds from the completion of the supply of the photoresist and, while letting the air blow after one second, the air blowing nozzle 27 is moved at a speed of 25 mm/second to a position of 50 mm from the center of the semiconductor wafer 21 toward the outer periphery of the semiconductor wafer 21. After this, the air blowing nozzle, while allowing the blow of the air, is moved at a speed of 50 mm/second to the outer periphery of the semiconductor wafer 21. At this time, the air blowing nozzle 27 is set at an angle θ of 20° to 60°, preferably, 45°, with respect to and in opposition to the semiconductor wafer 21.

According to the present embodiment, as set out above, the drying time of the photoresist (or anti-reflection material) can be set relative to an individual position on the semiconductor wafer by individually setting the air blowing position on the semiconductor wafer and the air blowing time. By doing so, the thickness uniformity of the photoresist film or anti-reflection film is improved. Since the drying time at a restricted position can be shortened, even if the size of the semiconductor wafer is made larger than in the conventional case, it is possible to decrease the drying time difference at the position of the semiconductor wafer and improve the efficiency of the drying process.

A third embodiment of the present invention will now be explained below with reference to FIG. 5.

Figure 5:
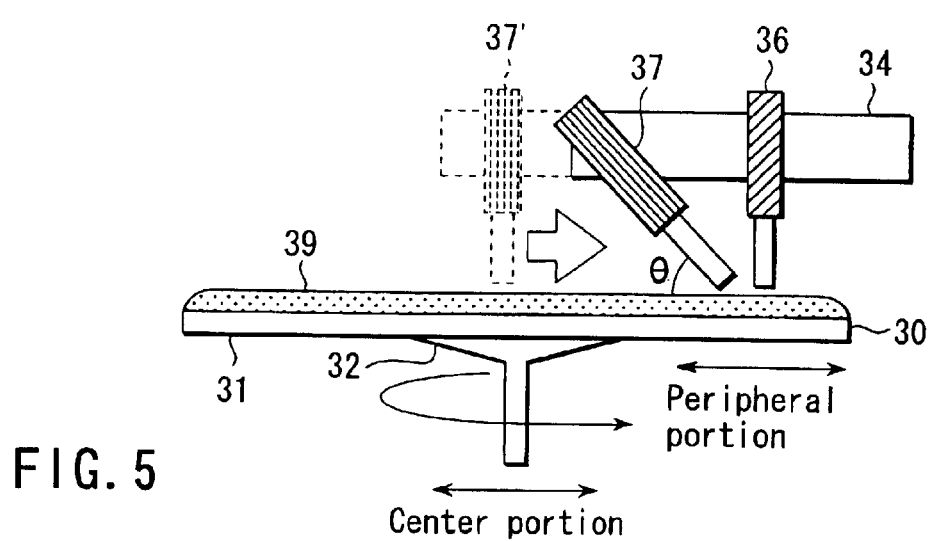
FIG. 5 is a partial cross-sectional view showing a device for forming a resist film as a coating film according to a third embodiment of the present invention which explains a process for drying a semiconductor wafer.

FIG. 5 is a partial cross-sectional view for explaining the drying process of a semiconductor wafer portion in a coating film forming device for forming a resist coating film (the third embodiment). A semiconductor wafer, such as silicon, serving as a substrate to be processed is suction held by a vacuum chuck and rotatably supported by a spin chuck 32 in the device. The device includes a first arm (not shown) movable to a position above the spin chuck 32 and a second arm 34 movable from the center of the semiconductor wafer 31 toward the periphery 30 of the semiconductor wafer. A photoresist supply nozzle is set at the first arm and both a solvent supply nozzle (not shown) and air blowing nozzle 37 are set at the second arm 34. The photoresist supply nozzle is held in a storage section in the device when it is not used.

An explanation will be made below about the resist coating method using the resist coating apparatus of this embodiment. First, the semiconductor wafer 31 is rotated by the spin chuck 32 at a high rotation speed of a few thousand rpm. In this state, the first arm is moved to a position above the spin chuck 32 and the photoresist is discharged for a few seconds from the photoresist supply nozzle to form a coating film 39 of the photoresist or anti-reflection film. The coating film 39 is spread over the whole surface of the semiconductor wafer 31 after about one to four seconds from the dropwise supply of the photoresist from the photoresist supply nozzle onto the semiconductor wafer 31. After this, while the semiconductor wafer 31 is being rotated at a rotation speed of a few thousand rpm, the first arm is moved into a photoresist supply nozzle storage section and stored there.

It is preferable to let the air or gas such as a nitrogen gas blow vertically onto an area to be dried. If, however, a coating film at the peripheral portion of the semiconductor wafer is to be removed with a solvent, it is preferable that, in order to make an ending edge of the coating film not thicker and efficiently eliminate a liable-to-produce foreign material from the semiconductor wafer, the air or gas is let to blow at an angle of about 20° to 60° with respect to the semiconductor wafer in a direction from the center of the semiconductor wafer toward an outside.

In order to increase the drying speed, an air blowing nozzle 37 of this embodiment has its blowing hole set in opposition to the semiconductor wafer 31 at the center of the semiconductor wafer 31 as indicated by 37' but, at an area extending toward the outer periphery of the wafer beyond that center, set at an angle θ of 20° to 60°, preferably 45°, with respect to and in opposition to the semiconductor wafer. By letting the air or gas such as a nitrogen gas blow at a flow rate of 20 to 30 ml/minute while rotating the semiconductor wafer 31 at a rotation speed of a few thousand rpm, the photoresist from the center to the outer periphery of the semiconductor wafer can be dried about 2 to 3 times faster than in the conventional case.

After this, from a solvent supply nozzle 36 set at the second arm 34, a solvent such as thinner is discharged at a flow rate of 15 ml/minute at a position 2.0 mm inward the semiconductor wafer from the outer periphery of the semiconductor wafer 31 to remove the photoresist 39 at the outer peripheral portion of the semiconductor wafer 31. The air blowing nozzle 37 is operated in interlock with the solvent supply nozzle 36 and the solvent supply nozzle 36 while, at the same time, the air or nitrogen gas is let to blow from the center of the semiconductor wafer 31 toward an outside at a contacting area between the solvent from the nozzle 36 and the photoresist film (coating film) 39. After this, the semiconductor wafer 1 is rotated at a high speed of a few thousand rpm to spin-dry the solvent on the outer peripheral portion of the semiconductor wafer 1 and, by doing so, a series of coating process is ended. At this time, the air blowing nozzle 37 is set at an angle of θ 20° to 60°, preferably 45°, with respect to and in opposition to the semiconductor wafer 31 at an area extending toward the outer periphery of the semiconductor wafer beyond the wafer center.

In this way, the air blowing nozzle 37 for letting the air blow onto the photoresist film can be set at any angle to any position on the surface of the semiconductor wafer 31 and be moved at any speed after the photoresist film has been formed on the surface of the semiconductor wafer 21. Since the drying time can be partially shortened, even if the size of the semiconductor wafer is larger than in the conventional case, it is possible to decrease the drying time difference at the respective position of the semiconductor wafer and improve the efficiency of the drying process.

A fourth embodiment of the present invention will be explained below with reference to FIG. 6 and FIGS. 7A, 7B and 7C.

Figure 6:
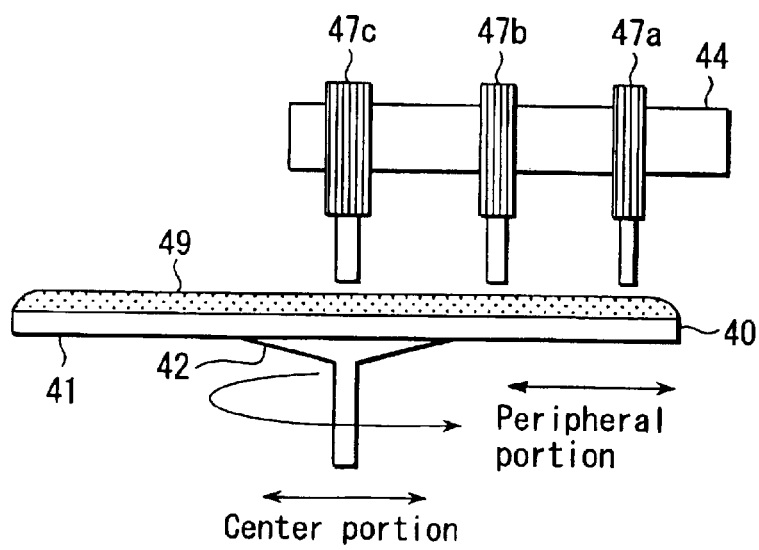
FIG. 6 is a partial cross-sectional view showing a gas blowing nozzle unit arranged above a semiconductor wafer in a coating film forming device according to a fourth embodiment of the present invention.

FIG. 6 is a partial cross-sectional view showing a semiconductor wafer and its upper-side gas blowing nozzle unit in the coating film forming device for forming a coating film such as a photoresist. As shown in FIG. 6, a semiconductor wafer 41 such as silicon serving as a substrate to be processed is suction held by a vacuum chuck and rotatably supported by the spin chuck 42 capable of a high speed rotation. The device has a first arm, not shown, movable to a position above the spin chuck 42 and a second arm 44 movable from the center of the semiconductor wafer 41 toward the outer periphery 40 of the semiconductor wafer 41. The first arm has a photoresist supply nozzle and the second arm 44 has a solvent supply nozzle, not shown, and a plurality of (three in the embodiment) air blowing nozzles, 47a, 47b, 47c.

In the case where a coating film, such as a photoresist, on the semiconductor wafer is spin-dried, the rotation speed of the semiconductor wafer is slower at a central portion than at an outer peripheral portion and, even if the drying of the outer peripheral portion is completed, there is sometimes the case where the central portion is not yet dried. According to the present embodiment it is possible to eliminate such a situation. That is, the air blowing nozzles are so set that a nozzle of a larger bore, that is, a nozzle of a greater blow amount, is located nearer to the center of the semiconductor wafer than the remaining ones. By using such a method it is possible to apply a uniform drying process to any portion of a coating film 49 on the semiconductor wafer 41.

Figure 7A:
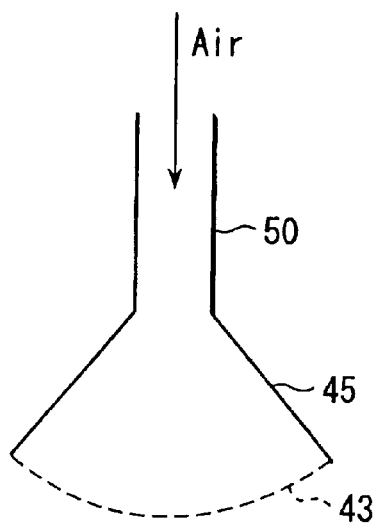
FIG. 7A is a partial cross-sectional view of a gas blowing nozzle arranged above the semiconductor wafer in the device according to the fourth embodiment of the present invention.
Figure 7B:
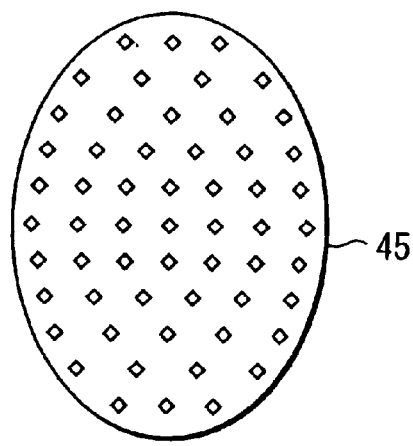
FIG. 7B is a plan view showing the gas blowing nozzle arranged above the semiconductor wafer in the coating film forming device according to the fourth embodiment of the present invention.
Figure 7C:
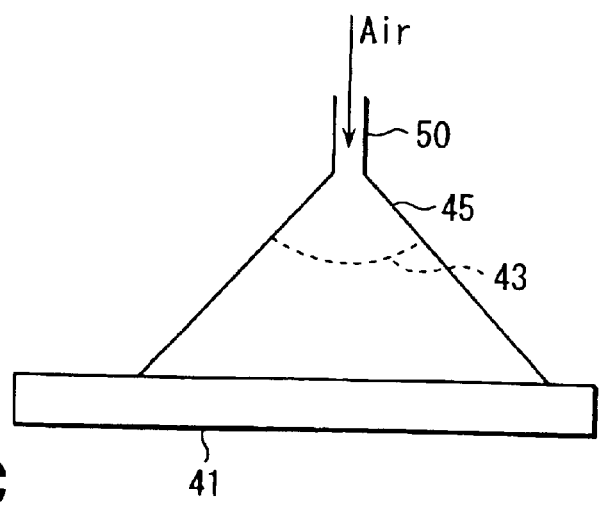
FIG. 7C is a cross-sectional view showing the gas blowing nozzle arranged above the semiconductor wafer in the coating film forming device according to the fourth embodiment of the present invention.

FIGS. 7A and 7B are a cross-sectional view and plan view, respectively, showing a gas blowing nozzle for the photoresist, etc., on the coating film forming device and FIG. 7C is a cross-sectional view showing the gas blowing nozzle for the photoresist, etc., which is set over the semiconductor wafer on the coating film forming device. The blowing nozzle lets the air or gas, such as a nitrogen gas, blow locally onto the semiconductor wafer. If, however, the blowing area is wider, the drying process is hastened with a resultant added advantage. As shown in FIGS. 7A and 7C, the gas blowing nozzle 50 is so configured as to make the discharge hole size larger at its forward end side than the nozzle size. Inside the discharge hole, a partition 43 is provided to allow a gas flow to be guided. Since the gas blowing nozzle is so configured as set out above, a greater amount of gas is discharged via the nozzle 50 as shown in FIG. 7C and the drying of the coating film on the semiconductor wafer 41 is efficiently done.

An explanation will be made below about forming a semiconductor element on a semiconductor substrate by the use of the above-mentioned coating film forming method. On a semiconductor substrate, such as silicon, at which, for example, a polysilicon film patterned on a gate electrode is formed with a gate insulating film formed therebetween, a photoresist is coated as a coating film by any coating film forming method and the coating film is dried. Then the photoresist is exposed to light and developed by the known semiconductor technique to allow it to be patterned to a predetermined configuration. Then with the patterned resist used as a mask, the polysilicon film is patterned to form the polysilicon film as a gate electrode. As set out below, a semiconductor element is formed on the semiconductor substrate by the ordinary semiconductor technique.

In the conventional device and method of forming a coating film such as a resist, the coating film is simply spin-dried, so that a longer drying time is required. According to the respective embodiments, on the other hand, the air or gas is let to blow onto the coating film and, by doing so, it is possible to reduce the drying time largely and shorten the throughput.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a film comprising:

coating a liquid material on a surface of a substrate to form a material film of the liquid material the on the surface of the substrate, while rotating the substrate; and drying the material film, while rotating the substrate and letting air or nitrogen gas blow onto a predetermined area of the material film, which is from a rotation center side of the substrate to a peripheral portion side of the substrate.

2. The method of forming a film according to claim 1, wherein the predetermined area of the material film is a peripheral portion of the material film including a peripheral edge of the material film.

3. The method of forming a film according to claim 1, in which the air or nitrogen gas is blown onto the predetermined area of the material film in a direction substantially vertical onto the substrate when the predetermined area of the material film is positioned in the rotation center side of the substrate and the air or nitrogen gas is blown onto the predetermined area of the material film from the rotation center side of the substrate to the peripheral portion side of the substrate at an angle of 20° to 60° with respect to the surface of the substrate when the predetermined area of the material film is positioned at the peripheral portion of the substrate.

4. The method of forming a film according to claim 1, further comprises letting a solvent blow onto a portion of the material film which is on a peripheral portion of the substrate to remove the portion of the material film from the substrate.

5. The method of forming a film according to claim 2, further comprises letting a solvent blow onto a portion of the material film which is on a peripheral portion of the substrate to remove the portion of the material film from the substrate.

6. The method of forming a film according to claim 1, further comprises letting a solvent blow onto a portion of the material film which is on a peripheral portion of the substrate to remove the portion of the material film from the substrate.

7. The method of forming a film according to claim 3, further comprises letting a solvent blow onto a portion of the material film which is on a peripheral portion of the substrate to remove the portion of the material film from the substrate.

8. The method of forming a film according to claim 4, wherein air or nitrogen gas is blown to the portion of the material film, while or after letting the solvent blow onto the portion of the material film.

9. The method of forming a film according to claim 5, wherein air or nitrogen gas is blown to the portion of the material film, while or after letting the solvent blow onto the portion of the material film.

10. The method of forming a film according to claim 6, wherein air or nitrogen gas is blown to the portion of the material film, while or after letting the solvent blow onto the portion of the material film.

11. The method of forming a film according to claim 7, wherein air or nitrogen gas is blown to the portion of the material film, while or after letting the solvent blow onto the portion of the material film.

12. The method of forming a semiconductor device comprising:

coating a liquid material on a surface of a substrate to form a material film of the liquid material on the surface of the substrate, while rotating the substrate;

drying the material film under the rotation of the substrate while letting air or nitrogen gas blow onto a predetermined area of the material film, which is from a rotation center side of the substrate to a peripheral portion side of the substrate;

coating a resist on a surface of the material film to form a resist film on the surface of the material film, while rotating the substrate;

drying the resist film under the rotation of the substrate while letting air or nitrogen gas blow onto a predetermined area of the resist film;

patterning the resist film to form a resist pattern; and patterning the material film to form a material pattern of a predetermined shape using the resist pattern as a mask.

13. A film forming device comprising:

a supporting table configured to support a substrate; and a gas blowing nozzle provided in opposition to the substrate and configured to let a gas including air or nitrogen gas blow onto a predetermined area of the substrate, which is from a center side of the substrate to a peripheral portion side of the substrate.

* * * * *

UNITED STATES PATENT AND TRADEMARK OFFICE
CERTIFICATE OF CORRECTION

PATENT NO.    : 6,777,350 B2
DATED         : August 17, 2004
INVENTOR(S)   : Nakagawa It is certified that error appears in the above-identified patent and that said Letters Patent is hereby corrected as shown below:

<u>Column 9,</u>
Line 25, change "material the" to -- material --.

Signed and Sealed this

Seventh Day of December, 2004

JON W. DUDAS
*Director of the United States Patent and Trademark Office*